(12) United States Patent
Ohnishi et al.

(10) Patent No.: US 8,030,695 B2
(45) Date of Patent: Oct. 4, 2011

(54) STRUCTURE AND MANUFACTURING METHOD OF SEMICONDUCTOR MEMORY DEVICE

(75) Inventors: Tetsuya Ohnishi, Fukuyama (JP); Naoyuki Shinmura, Fukuyama (JP); Shinobu Yamazaki, Kasaoka (JP); Takahiro Shibuya, Fukuyama (JP); Takashi Nakano, Fukuyama (JP); Masayuki Tajiri, Fukuyama (JP); Shigeo Ohnishi, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/976,113

(22) Filed: Dec. 22, 2010

(65) Prior Publication Data

US 2011/0089395 A1     Apr. 21, 2011

Related U.S. Application Data

(62) Division of application No. 11/274,258, filed on Nov. 16, 2005, now Pat. No. 7,879,626.

(30) Foreign Application Priority Data

Nov. 17, 2004   (JP) ................................ 2004-333130

(51) Int. Cl.
    *H01L 21/02* (2006.01)
(52) U.S. Cl. ................ 257/295; 257/292; 257/E21.295; 257/E27.004
(58) Field of Classification Search .................. 257/295, 257/E21.295
    See application file for complete search history.

(56) References Cited

U.S. PATENT DOCUMENTS

| 5,281,837 | A | 1/1994 | Kabyama |
| 6,285,051 | B1 | 9/2001 | Ueda et al. |
| 6,420,754 | B2 | 7/2002 | Takahashi et al. |
| 6,569,745 | B2 | 5/2003 | Hsu |
| 6,583,003 | B1 | 6/2003 | Hsu et al. |
| 6,649,957 | B2 * | 11/2003 | Hsu et al. ...................... 257/295 |
| 2002/0036934 | A1 | 3/2002 | Hasegawa et al. |
| 2002/0045311 | A1 | 4/2002 | Mikawa |
| 2002/0097600 | A1 | 7/2002 | Ning |
| 2002/0098281 | A1 | 7/2002 | Ning |
| 2002/0115226 | A1 | 8/2002 | Mikawa et al. |
| 2002/0196654 | A1 * | 12/2002 | Mitarai et al. ................ 365/145 |
| 2003/0001178 | A1 | 1/2003 | Hsu et al. |
| 2003/0003674 | A1 | 1/2003 | Hsu et al. |
| 2003/0003675 | A1 * | 1/2003 | Hsu .............................. 438/385 |
| 2003/0148545 | A1 | 8/2003 | Zhuang et al. |
| 2003/0203585 | A1 * | 10/2003 | Hsu .............................. 438/385 |
| 2003/0206481 | A1 | 11/2003 | Hsu et al. |
| 2003/0214742 | A1 | 11/2003 | Kai et al. |
| 2004/0063274 | A1 | 4/2004 | Hsu et al. |

(Continued)

FOREIGN PATENT DOCUMENTS

EP     1 403 920 A2     3/2004

(Continued)

*Primary Examiner* — Kiesha Bryant
*Assistant Examiner* — Igwe U Anya
(74) *Attorney, Agent, or Firm* — Nixon & Vanderhye P.C.

(57) ABSTRACT

A semiconductor memory device having a cross point structure includes a plurality of upper electrodes arranged to extend in one direction, and a plurality of lower electrodes arranged to extend in another direction at a right angle to the one direction of the upper electrodes. Memory materials are provided between the upper electrodes and the lower electrodes for storage of data. The memory materials are made of a perovskite material and arranged at the lower electrodes side of the corresponding upper electrode extending along the corresponding upper electrode.

7 Claims, 6 Drawing Sheets

U.S. PATENT DOCUMENTS

| | | |
|---|---|---|
| 2004/0147081 A1 | 7/2004 | Hsu et al. |
| 2004/0160805 A1 | 8/2004 | Rinerson et al. |
| 2004/0188742 A1 | 9/2004 | Honma et al. |
| 2005/0135148 A1 | 6/2005 | Chevallier et al. |
| 2005/0169043 A1 | 8/2005 | Yokoyama et al. |
| 2005/0174835 A1 | 8/2005 | Rinerson et al. |
| 2005/0186334 A1 | 8/2005 | Otabe |
| 2005/0230724 A1 | 10/2005 | Hsu |
| 2005/0242338 A1 | 11/2005 | Hart et al. |
| 2005/0275003 A1 | 12/2005 | Shinmura |
| 2006/0018149 A1 | 1/2006 | Rinerson et al. |
| 2006/0081962 A1 | 4/2006 | Wei et al. |
| 2006/0097288 A1 | 5/2006 | Baek et al. |
| 2006/0226409 A1 | 10/2006 | Burr et al. |

FOREIGN PATENT DOCUMENTS

| | | |
|---|---|---|
| EP | 1 441 391 A2 | 7/2004 |
| EP | 1 533 815 A2 | 5/2005 |
| JP | 2002-94020 | 3/2002 |
| JP | 2003-68983 | 3/2003 |
| JP | 2003-68984 | 3/2003 |
| JP | 2003-197877 | 7/2003 |
| JP | 2003-243622 | 8/2003 |
| JP | 2003-282838 | 10/2003 |
| JP | 2004-303988 | 10/2004 |
| JP | 2006-032728 | 2/2006 |

\* cited by examiner (a) A–A' Cross Sectional View

B–B' Cross Sectional View (b) A–A' Cross Sectional View

B–B' Cross Sectional View (c) A–A' Cross Sectional View

B–B' Cross Sectional View (d) A–A' Cross Sectional View

B–B' Cross Sectional View (e) A–A' Cross Sectional View

B–B' Cross Sectional View (f) A–A' Cross Sectional View

B–B' Cross Sectional View (a) A−A' Cross Sectional View

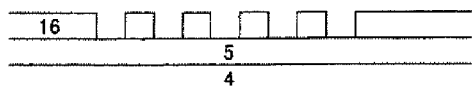

B−B' Cross Sectional View

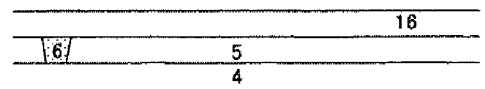

(b) A−A' Cross Sectional View

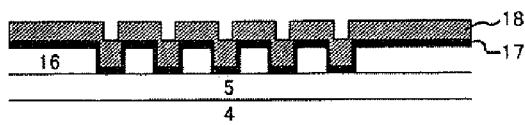

B−B' Cross Sectional View

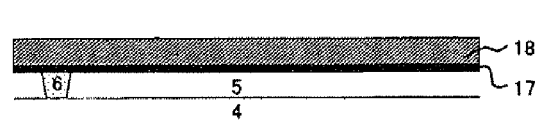

(c) A−A' Cross Sectional View

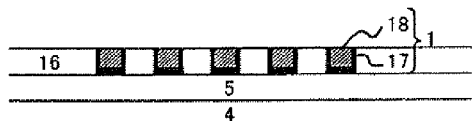

B−B' Cross Sectional View

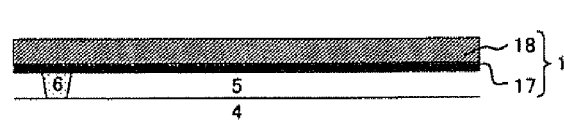

(d) A−A' Cross Sectional View

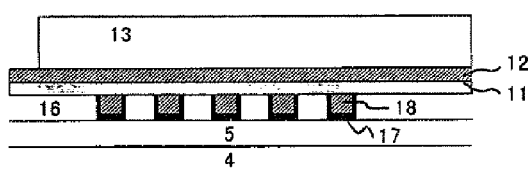

B−B' Cross Sectional View

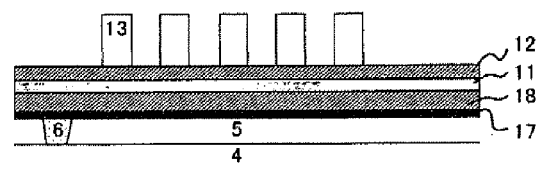

(e) A−A' Cross Sectional View

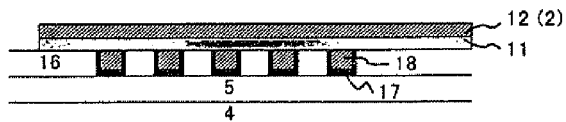

B−B' Cross Sectional View

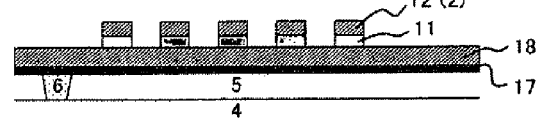

(f) A−A' Cross Sectional View

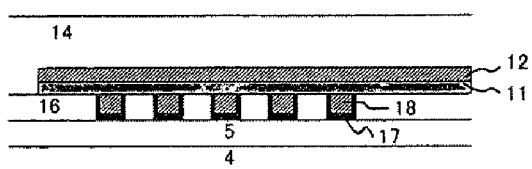

B−B' Cross Sectional View

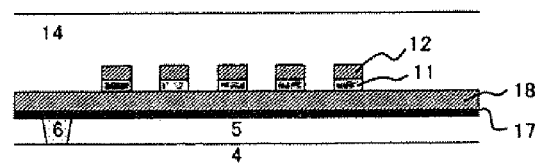

(g) A−A' Cross Sectional View

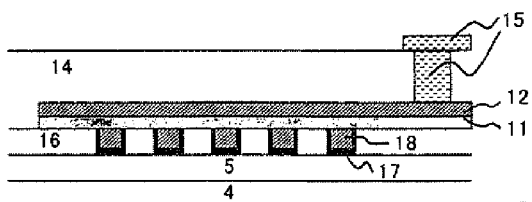

B−B' Cross Sectional View

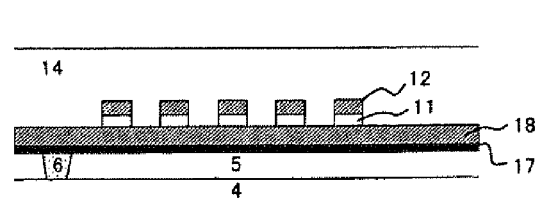

Fig.5

(a) A-A' Cross Sectional View   B-B' Cross Sectional View

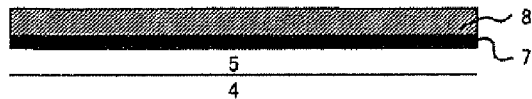
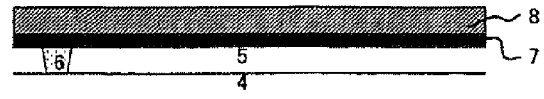

(b) A-A' Cross Sectional View   B-B' Cross Sectional View

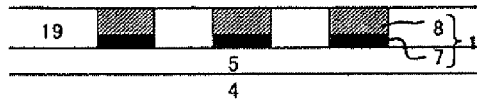
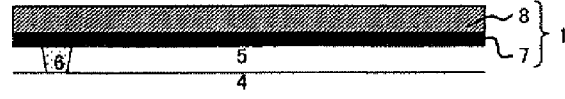

(c) A-A' Cross Sectional View   B-B' Cross Sectional View

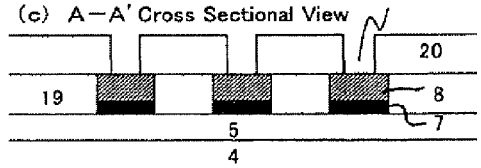
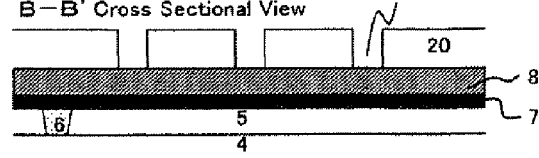

(d) A-A' Cross Sectional View   B-B' Cross Sectional View

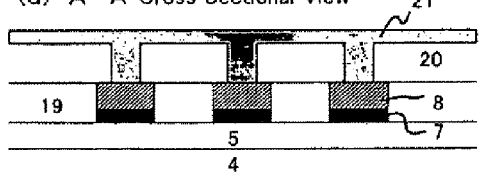
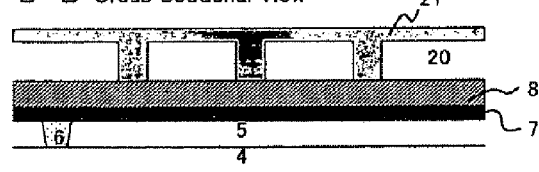

(e) A-A' Cross Sectional View   B-B' Cross Sectional View

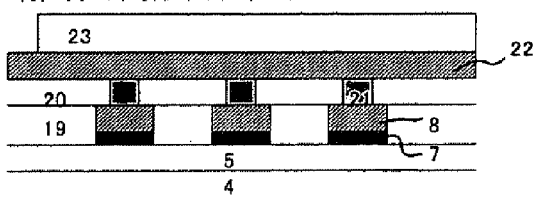
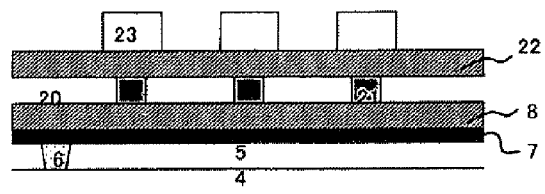

(f) A-A' Cross Sectional View   B-B' Cross Sectional View

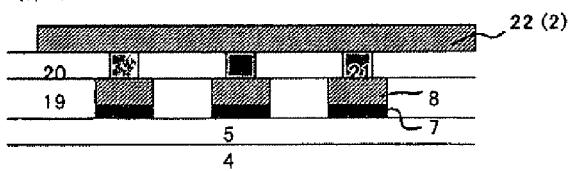
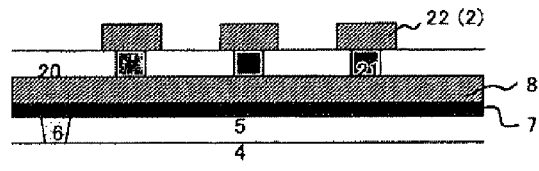

(g) A-A' Cross Sectional View   B-B' Cross Sectional View

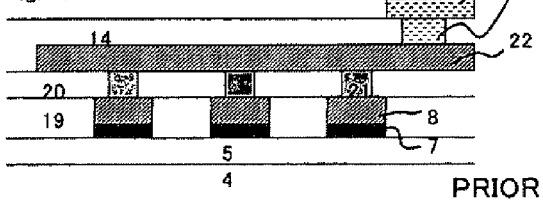
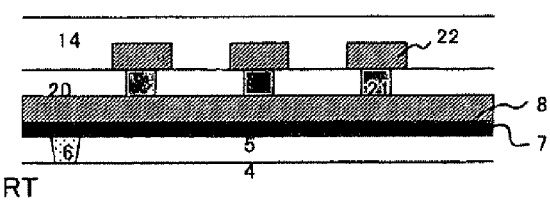

PRIOR ART
Fig.6

STRUCTURE AND MANUFACTURING METHOD OF SEMICONDUCTOR MEMORY DEVICE

CROSS REFERENCE TO RELATED APPLICATION

This application is a divisional of U.S. application Ser. No. 11/274,258, filed Nov. 16, 2005 now U.S. Pat. No. 7,879,626 which claims priority under 35 U.S.C. §119(a) on Patent Application No. 2004-333130 filed in Japan on Nov. 17, 2004, the entire contents of which are hereby incorporated by reference.

BACKGROUND

1. Field

The described technology relates to a semiconductor memory device having a cross point structure and a method for manufacturing the same which comprises a plurality of upper electrodes arranged to extend in one direction, a plurality of lower electrodes arranged to extend in another direction at a right angle to the one direction of the upper electrodes, and a group of memory materials provided between the upper electrodes and the lower electrodes for storage of data.

2. Description of the Related Art

In general, a semiconductor memory device such as DRAM, NOR flash memory, or FeRAM is arranged in which each memory cell comprises a memory element for storage of data and a selecting transistor for selectively operating the memory element. On the other hand, the semiconductor memory having a cross point structure is arranged not including the selecting transistor but having a memory material provided as the memory element at the intersection (cross point) between the bit line and the word line. Since a stored data is read directly from its cross point at the bit line and the word line, the semiconductor memory can be simple in the construction and thus easily increased in the storage size regardless of some drawbacks such as the speed of data reading may be declined by the effect of parasitic current leaked from the unselected cells and the consumption of current may be increased more or less.

It is known that such a cross point memory having the cross point structure has the memory materials implemented by a perovskite material. Examples of the perovskite material are a colossal magneto-resistant (CMR) material and a high-temperature super-conductive (HTSC) material, having an electric resistivity which can be modified by an external control. In particular, the CMR or HTSC material can be varied in the resistivity by short pulses applied to its thin film or bulk body. The pulses to be applied have to be set to a small level in the electric field strength or current density enough to switch the physical state of the material from one to another as well as to give no fracture nor serious damage to the material. The material can thus be modified in the property by the action of the pulses. More specifically, the material can be modified in steps by a series of the pulses. One particular property of the material to be modified is the electrical resistivity. When the pulses are used of which the polarity is opposite to that of pulses introduced at the initial stage of modification, the property of the material can be inverted at least partially.

Some examples of the cross point memory employing a perovskite material are disclosed in JP-A 2003-68984, JP-A 2003-68983 and JP-A 2003-197877.

The construction and the method for manufacturing such a cross point memory employing a perovskite material will now be explained referring to FIGS. 2 and 6. FIG. 2 illustrates a plan layout view of memory cells in a conventional cross point memory. FIGS. 6(a), 6(b), 6(c), 6(d), 6(e), 6(f), and 6(g) are cross sectional views taken along the line A-A' and the line B-B' of FIG. 2 showing steps of a procedure of manufacturing the conventional memory cells.

The procedure starts with, as shown in FIG. 6(a), depositing a BPSG layer 5 of 1500 nm thick on a silicon semiconductor substrate 4 accompanied with a memory circuit and polishing the same to a thickness of 1000 nm by a CMP (Chemical Mechanical Polishing) process to have a planar surface. Then, a contact plug 6 is provided for connecting between the silicon semiconductor substrate 4 and the lower electrodes 1. In succession, a sputtering process is conducted for depositing on the BPSG layer 5 a 50 nm thickness of TiN layer 7 which is made of a lower electrode material and turns to the lower electrodes 1 and a 150 nm thickness of Pt layer 8 on the TiN layer 7.

This is followed by a photolithography process of providing a stripe, L/S (line and space) pattern of masking resist (not shown) for configuring the lower electrodes and dry etching both the TiN layer 7 and the Pt layer 8 to build the lower electrodes 1 after removal of the resist, as shown in FIG. 6(b). Then, an $SiO_2$ layer 19 is deposited to a thickness of 500 nm by a CVD (Chemical Vapor Deposition) process and flattened by a CMP process to expose the surface of the Pt layer 8.

Then, as shown in FIG. 6(c), an $SiO_2$ layer 20 is deposited to a thickness of 300 nm on the $SiO_2$ layer 19 and the lower electrodes 1 (of the Pt layer 8) by a CVD process. Another lithography process follows for masking with a pattern of resists (not shown) which have an array of openings 3 for forming active layers at the intersections between the lower electrodes 1 and the upper electrodes 2. Then, the $SiO_2$ layer 20 is dry etched at the openings to expose the Pt layer 8 for the active layers.

A sputtering process follows for depositing on the Pt layer 8 and the $SiO_2$ layer 20 a $Pr_{0.7}Ca_{0.3}MnO_3$ (PCMO) layer 21 to a thickness of 200 nm which will turn to the perovskite memory materials as shown in FIG. 6(d). The PCMO layer 21 is then polished by a CMP process to expose the $SiO_2$ layer 20 and then a Pt layer 22 is deposited to a thickness of 100 nm by a sputtering process which will turn to the upper electrodes 2.

This is followed by a photolithography process for providing a corresponding stripe, L/S (line and space) pattern of resist 23 to the upper electrodes 2 at the lower electrodes 1 as shown FIG. 6(e). With the resist 23 used as a mask, the Pt layer 22 is etched by a dry etching process to configure the upper electrodes 2 (of the Pt layer 22) as shown in FIG. 6(f).

Further, an $SiO_2$ layer 14 is deposited to a thickness of 1200 nm on the Pt layer 22 by a CVD process and polished to a thickness of 800 nm by a CMP process to flatten the surface. Then, a pattern of Al wiring 15 is provided for connecting between the Pt layer 22 of the upper electrodes 2 and the silicon semiconductor substrate 4, as shown in FIG. 6(g).

However, each of the conventional methods disclosed in the publications requires a dedicated lithography step of providing a perovskite material at the intersection of the cross point structure. In total, three lithography steps are needed as the dedicated step is added with the two essential steps for patterning the lower electrodes and the upper electrodes. Also, the conventional cross point memory has each intersection between the upper electrode and the lower electrode determined as a memory cell. This area is crucial for determining the level of data density.

In every conventional method, there is needed a margin for positioning the openings 3 over the memory material at the intersections between the lower electrodes 1 and the upper electrodes 2, as shown in FIG. 2. Accordingly, the width of each of the lower electrodes 1 and the upper electrodes 2 will be greater than the minimum of the line width and the interval to be patterned by an applicable process or the minimum of the feasible size in the process. When the minimum is a unit pitch of F, the margin is needed 0.5F at each side of the width of each of the lower electrodes 1 and the upper electrodes 2 and calculates a total of 2F. The area at the cross point is hence expressed by 3F by 3F along both the directions of the lower electrode 1 and the upper electrode 2 respectively. More particularly, the cell area in the semiconductor memory is sized by $3F \times 3F = 9F^2$ as denoted by the real line in FIG. 2 and will hardly be reduced.

SUMMARY OF THE INVENTION

The described technology has been developed for eliminating the above drawback and one of many objectives is to provide a semiconductor memory device and a method for manufacturing the same where the memory cell area is reduced to a size smaller than the minimum of the size feasible in the conventional method and the number of lithography processing steps is minimized.

For achievement of the object, a semiconductor memory device having a cross point structure which comprises a plurality of upper electrodes arranged to extend in one direction, a plurality of lower electrodes arrange to extend in another direction at a right angle to the direction of the upper electrodes, and an array of memory materials arranged between the upper electrodes and the lower electrodes for storage of data is particularly characterized in that the memory materials are made of a perovskite material and each of the memory materials is disposed at the lower electrodes side of the corresponding upper electrode extending along the corresponding upper electrode.

The semiconductor memory device described above may preferably be modified in which the material of the lower electrodes contains a substance for encouraging the epitaxial growth of the perovskite material.

The semiconductor memory device may more preferably be modified in which the material of the lower electrodes contains at least one selected from a platinum group of rare metals, a group of their alloys, an electrically conductive oxide group of Ir, Ru, Re, and Os, and another electrically conductive oxide group of SRO($SrRuO_3$), LSCO((LaSr)$CoO_3$), and YBCO($YbBa_2Cu_3O_7$).

The semiconductor memory device may further preferably be modified in which the material of the upper electrodes contains at least one selected from a platinum group of rare metals, a group of metals Ag, Al, Cu, Ni, Ti, Ta, and their alloys, an electrically conductive oxide group of Ir, Ru, Re, and Os, and another electrically conductive oxide group of SRO($SrRuO_3$), LSCO((LaSr)$CoO_3$), and YBCO ($YbBa_2Cu_3O_7$).

The semiconductor memory device may further preferably be modified in which the perovskite material is an oxide composed of at least one element selected from a group of Pr, Ca, La, Sr, Gd, Nd, Bi, Ba, Y, Ce, Pb, Sm, and Dy and at least one element selected from a group of Ta, Ti, Cu, Mn, Cr, Co, Fe, Ni, and Ga.

The semiconductor memory device may further preferably be modified in which the perovskite material is an oxide expressed by at least one formula (where $0 \leq X \leq 1$ and $0 \leq Z < 1$) selected from $Pr_{1-X}Ca_X[Mn_{1-Z}M_Z]O_3$ (where M is an element selected from a group of Cr, Co, Fe, Ni, and Ga), $La_{1-X}AE_XMnO_3$ (where AE is a bivalent alkali earth metal selected from a group of Ca, Sr, Pb, and Ba), $RE_{1-X}Sr_XMnO_3$ (where RE is a trivalent rare earth element selected from a group of Sm, La, Pr, Nd, Gd, and Dy), $La_{1-X}Co_X[Mn_{1-Z}Co_Z]O_3$, $Gd_{1-X}Ca_XMnO_3$, and $Nd_{1-X}Gd_XMnO_3$.

For achievement of the object, a method for manufacturing the semiconductor memory device having a cross point structure described above comprises depositing in a succession on a semiconductor substrate the lower electrode material for lower electrodes and a surface protecting layer for protecting the surfaces of the lower electrodes, patterning the lower electrode material and the surface protecting layer with the use of a lower electrode masking to configure the lower electrodes, depositing a first insulating material on the lower electrodes and the surface protecting layer, of flattening the first insulating material to expose the surface protecting layer, removing the surface protecting layer, depositing the memory material of a perovskite material on the lower electrodes and the first insulating material, depositing the upper electrode material for upper electrodes on the memory material, patterning the memory material and the upper electrode material with the use of an upper electrode masking to configure the upper electrodes, and depositing a second insulating material on the upper electrodes.

For achievement of the object, a method of manufacturing the semiconductor memory device having a cross point structure described above comprises depositing on a semiconductor substrate the lower electrode material for lower electrodes, patterning the lower electrode material with the use of a lower electrode masking to configure the lower electrodes, depositing a first insulating material on the lower electrodes, flattening the first insulating material to expose the surfaces of the lower electrodes, depositing the memory material of a perovskite material on the lower electrodes and the first insulating material, depositing the upper electrode material for upper electrodes on the memory material, patterning the memory material and the upper electrode material with the use of an upper electrode masking to configure the upper electrodes, and depositing a second insulating material on the upper electrodes.

For achievement of the object, a method of manufacturing the semiconductor memory device having a cross point structure described above comprises depositing on a semiconductor substrate a first insulating material, patterning the first insulating material with the use of a lower electrode masking, depositing the lower electrode material for lower electrodes on the patterned first insulating material, flattening the lower electrode material to expose the surface of the first insulating material and configure the lower electrodes, depositing the memory material of a perovskite material on the lower electrodes and the first insulating material, depositing the upper electrode material for upper electrodes on the memory material, patterning the memory material and the upper electrode material with the use of an upper electrode masking to configure the upper electrodes, and depositing a second insulating material on the upper electrodes.

Any one of the methods for manufacturing the semiconductor memory device described above may preferably be modified in which the step of pattering with the lower electrode masking includes a process of dry etching.

Any one of the methods for manufacturing the semiconductor memory device described above may more preferably be modified in which the step of flattening includes a process of chemical and mechanical polishing.

Any one of the methods for manufacturing the semiconductor memory device described above may further preferably be modified in which the step of pattering with the upper electrode masking includes a process of dry etching.

Any one of the methods for manufacturing the semiconductor memory device described above may further be characterized by a step of patterning a memory circuit prior to the step of depositing the perovskite material.

BRIEF DESCRIPTION OF THE DRAWINGS

FIG. 5 is a cross sectional view of the memory cells showing a third non-limiting example method for manufacturing the semiconductor memory device; and FIG. 6 is a cross sectional view of the memory cells showing steps of the procedure of a conventional method.

DETAILED DESCRIPTION OF THE INVENTION

Some embodiments of a semiconductor memory devices and a method for manufacturing the same will be described in more detail referring to FIG. 1 and FIGS. 3 to 5.

Figure 1:
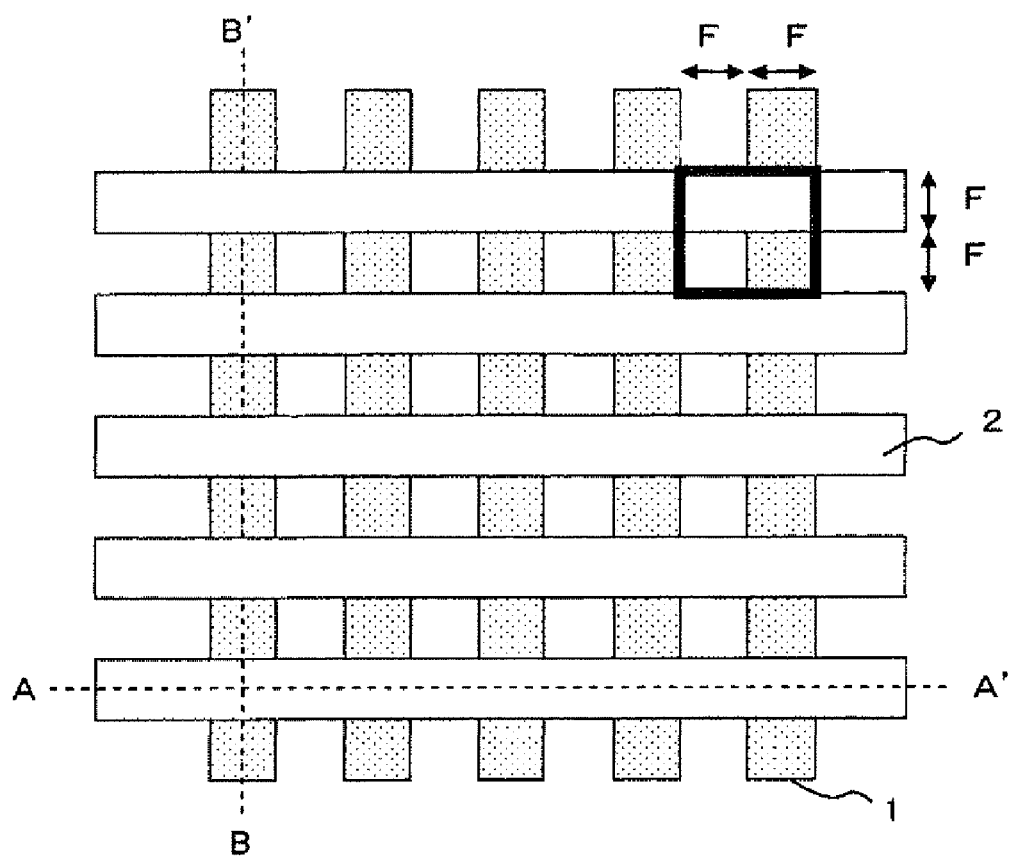
FIG. 1 is plan layout view showing memory cells of a semiconductor memory device according to a non-limiting embodiment.
Figure 2:
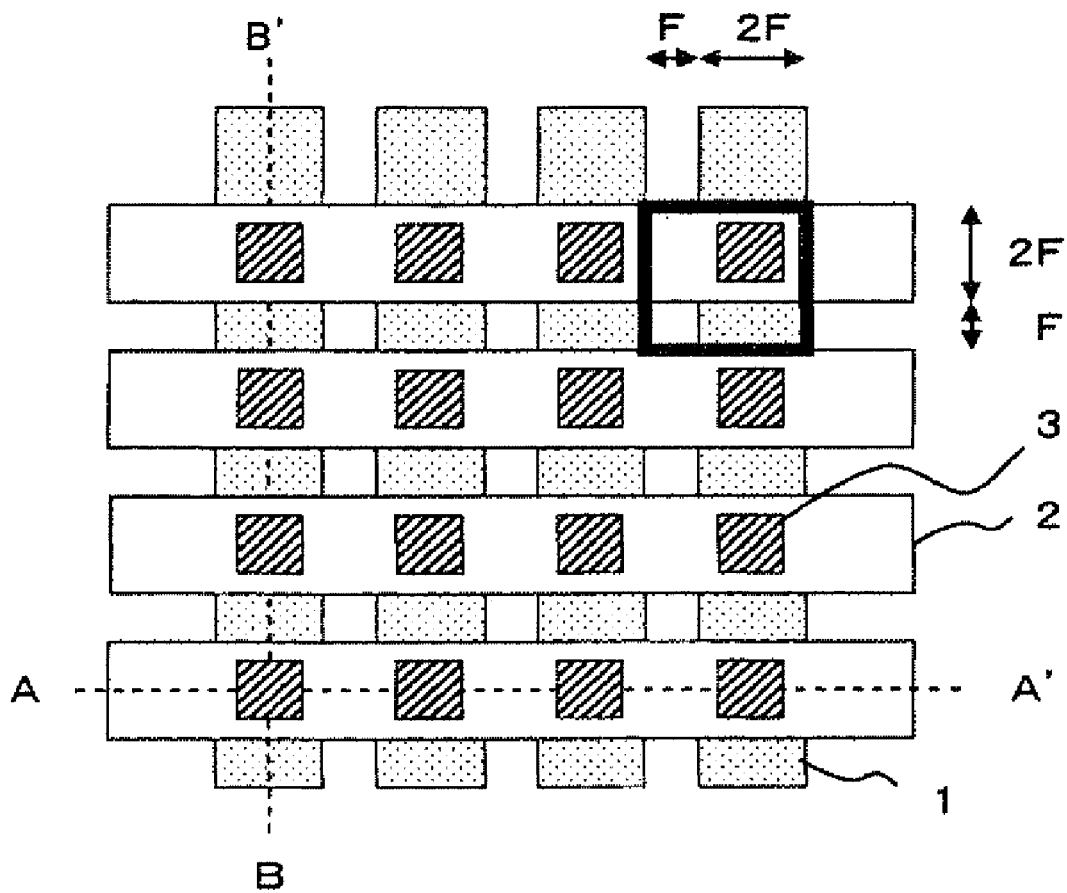
FIG. 2 is a plan layout view showing memory cells of a conventional semiconductor memory device.
Figure 3:
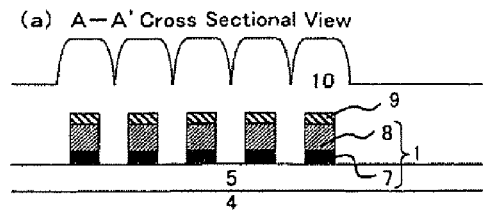
FIG. 3 is a cross sectional view of the memory cells showing a first non-limiting example method for manufacturing the semiconductor memory device according to the present invention.
Figure 3:
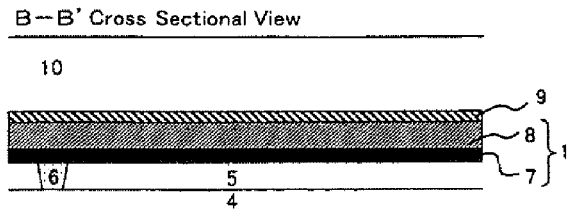
Figure 3:
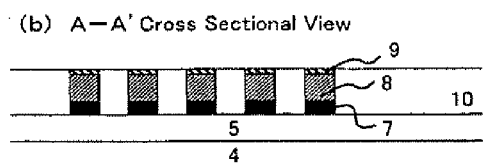
Figure 3:
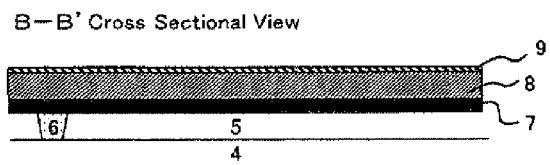
Figure 3:
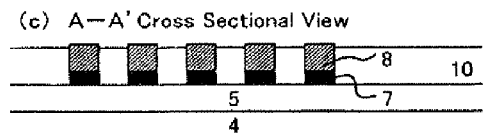
Figure 3:
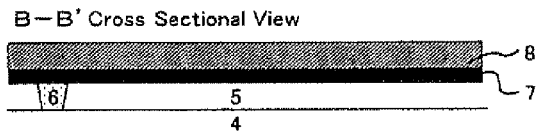
Figure 3:
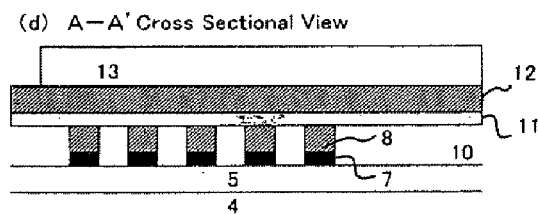
Figure 3:
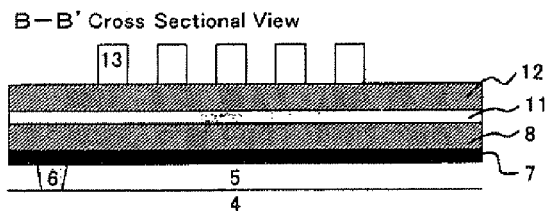
Figure 3:
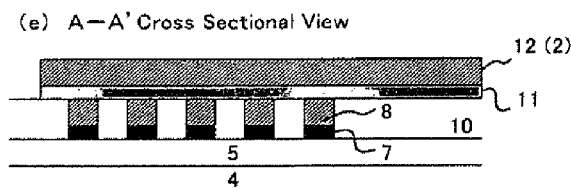
Figure 3:
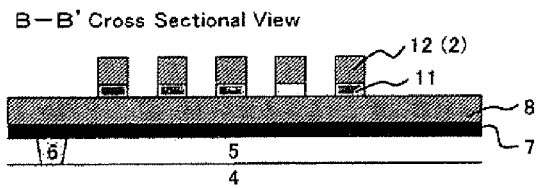
Figure 3:
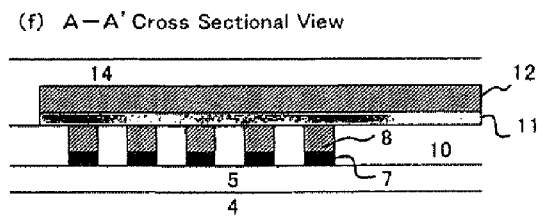
Figure 3:
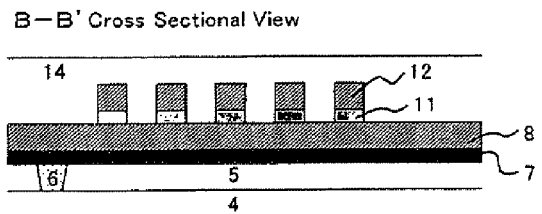
Figure 3:
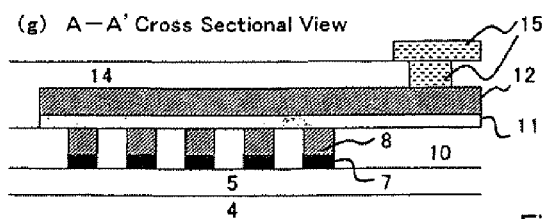
Figure 3:
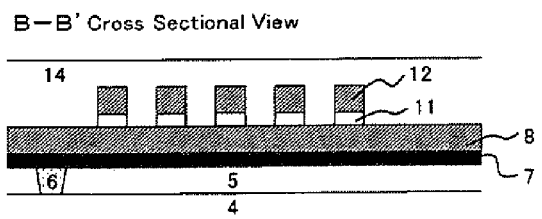
Figure 4:
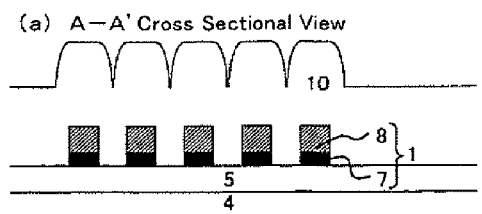
FIG. 4 is a cross sectional view of the memory cells showing a second non-limiting example method for manufacturing the semiconductor memory device.
Figure 4:
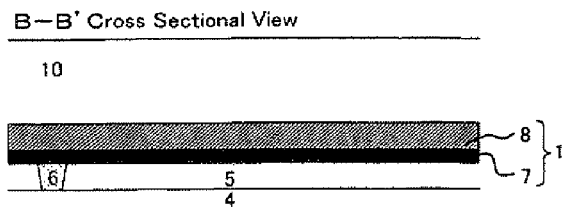
Figure 4:
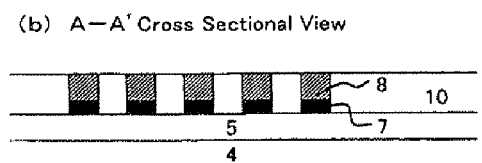
Figure 4:
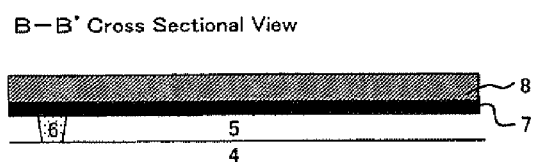
Figure 4:
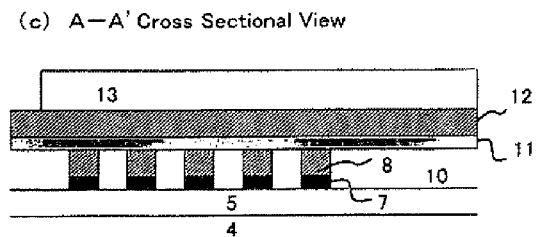
Figure 4:
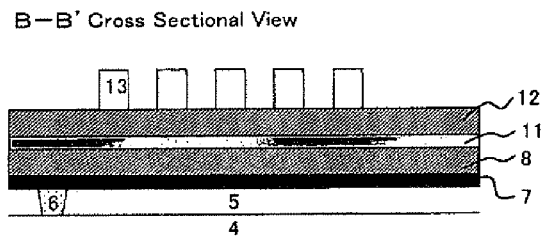
Figure 4:
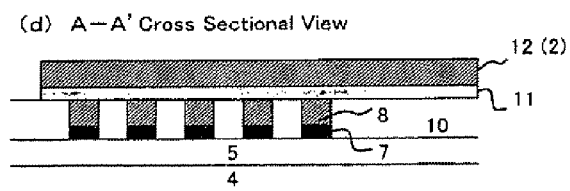
Figure 4:
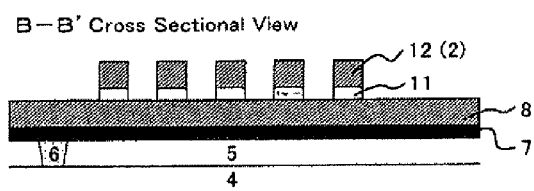
Figure 4:
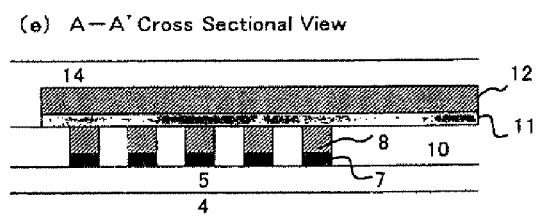
Figure 4:
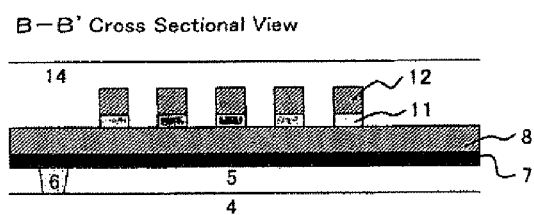
Figure 4:
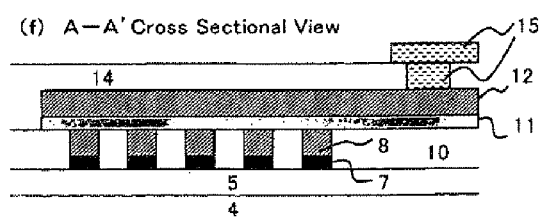
Figure 4:
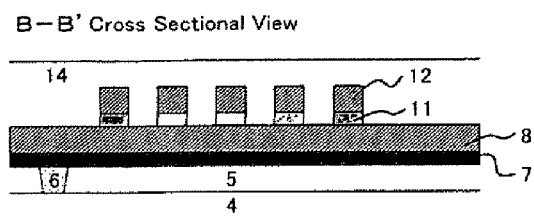

The semiconductor memory device according to an embodiment comprises, as shown in FIG. 1, a plurality of upper electrodes 2 arranged to extend in one direction, a plurality of lower electrodes 1 arranged to extend substantially at a right angle to the one direction of the upper electrodes 2, and a group of memory materials provided between the upper electrodes 2 and the lower electrodes 1 for storage of data. The memory materials are made of a perovskite material and arranged at the lower electrodes 1 side of the corresponding upper electrodes 2 extending along the corresponding upper electrode 2. In this embodiment, the memory materials are formed together with the upper electrodes 2 as their shape are substantially identical to that of the upper electrodes 2.

First Embodiment

The first embodiment will now be described in the form of a method of manufacturing a semiconductor memory device which has an array of memory cells of cross point structure, referring to the relevant drawings. FIG. 1 is a plan layout view of the memory cells in the semiconductor memory device of the first embodiment. FIGS. 3(a), 3(b), 3(c), 3(d), 3(e), 3(f), and 3(g) are cross sectional views taken along the line A-A' and the line B-B' of FIG. 1 showing process of manufacturing the embodiment.

The process starts with, as shown in FIG. 3(a), depositing a BPSG layer 5 of 1500 nm thick on a silicon semiconductor substrate 4 accompanied with a memory circuit and polishing the same to a thickness of 1000 nm by a CMP (Chemical Mechanical Polishing) process to have a planar surface. Then, a contact plug 6 is provided for connecting between the silicon semiconductor substrate 4 and the lower electrodes 1. In succession, a sputtering process is conducted for depositing on the BPSG layer 5 a 50 nm thickness of TiN layer 7 which is made of a lower electrode material and turns to the lower electrodes 1 and a 150 nm thickness of Pt layer 8 on the TiN layer 7. The lower electrode material may be an electrically conductive oxide or any applicable conductive material. Preferably, the electrically conductive lower electrode material contains $YBa_2Cu_3O_7$ (YBCO) for encouraging the epitaxial growth of perovskite. The electrically conductive lower electrode material may be platinum or iridium. The lower electrodes 1 are deposited to a thickness ranging substantially from 5 nm to 500 nm. Then, an SiN layer 9 is deposited to a thickness of 150 nm by a CVD process, which acts as a surface protective layer on the electrode material (step 1).

This is followed by a photolithography process of providing a stripe, L/S (line and space) pattern of masking resist (not shown) for configuring the lower electrodes and dry etching the SiN layer 9, the Pt layer 8, and TiN layer 7 to build the lower electrodes 1 after removal of the resist (step 2). Then, an insulating $SiO_2$ layer 10 is deposited to a thickness of 600 nm on the lower electrodes 1 by CVD process (step 3). The insulating layer is not limited to the $SiO_2$ layer but may be selected from an SiN layer, a polyimide layer, an SiOF layer, and any other applicable insulating material layer. The insulating layer is deposited by any appropriate process such as pulsed laser deposition, rf sputtering, e-beam vapor deposition, thermal evaporation, organic metal deposition, spin-on deposition, or organic metal chemical vapor phase growth.

Next, as shown in FIG. 3(b), the insulating layer 10 is flattened by a CMP process to have the SiN layer 9 exposed at the top (step 4). The flattening action is not limited to the CMP process but may be selected from spin-on, a combination of spin-on and etching back, other applicable processes, and their combination. Then, the SiN layer 9 is removed off with the use of heated phosphor, as shown in FIG. 3(c) (step 5).

A sputtering process follows for depositing a $Pr_{0.7}Ca_{0.3}MnO_3$ (PCMO) layer 11 to a thickness of 100 nm, which will turn to the perovskite memory materials (step 6). The perovskite material has a variable of resistivity which varies depending on the electric signal. The perovskite material is preferably selected from colossal magneto-resistant (CMR) materials and high-temperature super-conductive (HTSC) materials. For example, when the perovskite material is PCMO, its thickness ranges preferably from 10 nm to 500 nm. The perovskite material may be deposited by any appropriate process selected from pulsed laser deposition, rf sputtering, e-beam vapor deposition, thermal evaporation, organic metal deposition, sol-gel deposition, and organic metal chemical vapor phase growth. Then, a Pt layer 12 is deposited by a sputtering process on the PCMO layer 11, which will turn to the upper electrodes 2 (step 7). Pt is a preferable conductive material on the perovskite material. In this embodiment, the Pt layer 12 is deposited to a thickness of 100 nm. The thickness of the upper electrode material is substantially 5 nm to 500 nm.

This is followed by a photolithography process providing a corresponding pattern of resist 13 to the upper electrodes 2 on the Pt layer 12, as shown in FIG. 3(d). With the resist 13 used as a mask, both the Pt layer 12 and the PCMO layer 11 are etched by dry etching. As the resist 13 has been removed, the upper electrodes 2 (from the Pt layer 12) and the memory materials (from the PCMO layer 11) are formed as shown in FIG. 3(e) (step 8).

Further, as shown in FIG. 3(f), an $SiO_2$ layer 14 is deposited to a thickness of 1200 nm by a CVD process and polished to a thickness of 800 nm by a CMP process to flatten the surface (step 9). Then, a pattern of Al wiring 15 is provided for connecting between the upper electrodes 2 and the silicon semiconductor substrate 4, as shown in FIG. 3(g).

The method of the first embodiment carries out the photolithography process two times for forming the cross points: the step of patterning the lower electrodes 1 (step 2) and the step of patterning the upper electrodes 2 (step 8). It is not necessary to provide the margins for positioning because the cross points are determined at the same time as of the patterning of the upper electrodes 2. Accordingly, once the minimum of the line width and the interval to be patterned by the applicable process or the minimum of the feasible size in the process has been determined as a unit pitch F, the lower electrodes 1 and the upper electrodes 2 are patterned at equal intervals of the unit pitch F as shown in FIG. 1. The area of a unit memory or cell at the cross point between the upper electrode 2 and the lower electrode 1 (which cross each other at a right angle) is expressed by 2F by 2F along both the directions of the lower electrode 1 and the upper electrode 2 respectively. More particularly, the cell area in the semiconductor memory device is sized by $2F \times 2F = 4F^2$ as denoted by the real line in FIG. 1.

Second Embodiment

The second embodiment will now be described in the form of another method for manufacturing the semiconductor memory device, referring to the relevant drawings. FIGS. 4(a), 4(b), 4(c), 4(d), 4(e), and 4(f) are cross sectional views taken along the line A-A' and the line B-B' of FIG. 1 showing a process of manufacturing the embodiment.

The process starts with, as shown in FIG. 4(a), depositing a BPSG layer 5 of 1500 nm thick on a silicon semiconductor substrate 4 accompanied with a memory circuit and polishing the same to a thickness of 1000 nm by a CMP process to have a planar surface. Then, a contact plug 6 is provided for connecting between the silicon semiconductor substrate 4 and the lower electrodes 1. In succession, a sputtering process is conducted for depositing on the BPSG layer 5 a 50 nm thickness of TiN layer 7 which is made of a lower electrode material and turns to the lower electrodes 1. Then, a Pt layer 8 is deposited to a thickness of 150 nm on the TiN layer 7 by a sputtering process (step 1). The lower electrode material may be an electrically conductive oxide or any applicable conductive material equal to that of the first embodiment. Preferably, the electrically conductive lower electrode material contains YBCO for encouraging the epitaxial growth of perovskite. The electrically conductive lower electrode material may be platinum or iridium. The lower electrodes 1 are deposited to a thickness ranging substantially from 5 nm to 500 nm.

This is followed by a photolithography process for providing a stripe, L/S (line and space) pattern of masking resist (not shown) for configuring the lower electrodes and dry etching the Pt layer 8 and the TiN layer 7 to build the lower electrodes 1 after removal of the resist (step 2). Then, an insulating $SiO_2$ layer 10 is deposited to a thickness of 600 nm on the lower electrodes 1 by CVD process (step 3). The insulating layer is not limited to the $SiO_2$ layer but may be selected from an SiN layer, a polyimide layer, an SiOF layer, and any other applicable insulating material layer. The insulating layer is deposited by any appropriate process such as pulsed laser deposition, rf sputtering, e-beam vapor deposition, thermal evaporation, organic metal deposition, spin-on deposition, or organic metal chemical vapor phase growth.

Next, as shown in FIG. 4(b), the insulating layer 10 is flattened by a CMP process to have the Pt layer 8 exposed at the top (step 4). The flattening action is not limited to the CMP process but may be selected from spin-on, a combination of spin-on and etching back, other applicable processes, and their combination.

A sputtering process follows for depositing a perovskite PCMO layer 11 to a thickness of 100 nm (step 5). The perovskite material has a variable of resistivity which varies depending on the electric signal. The perovskite material is preferably selected from colossal magneto-resistant (CMR) materials and high-temperature super-conductive (HTSC) materials. For example, when the perovskite material is PCMO, its thickness ranges preferably from 10 nm to 500 nm. The perovskite material may be deposited by any appropriate process selected from pulsed laser deposition, rf sputtering, e-beam vapor deposition, thermal evaporation, organic metal deposition, sol-gel deposition, and organic metal chemical vapor phase growth. Then, a Pt layer 12 is deposited by a sputtering process on the PCMO layer 11, which will turn to the upper electrodes 2 (step 6). Pt is a preferable conductive material on the perovskite material. In this embodiment, the Pt layer 12 is deposited to a thickness of 100 nm. The thickness of the upper electrode material is substantially 5 nm to 500 nm.

This is followed by a photolithography process for providing a corresponding pattern of resist 13 to the upper electrodes 2 on the Pt layer 12, as shown in FIG. 4(c). With the resist 13 (not shown) used as a mask, both the Pt layer 12 and the PCMO layer 11 are etched by dry etching. As the resist 13 has been removed, the upper electrodes 2 (from the Pt layer 12) and the memory materials (from the PCMO layer 11) are formed as shown in FIG. 4(d) (step 7).

Further, as shown in FIG. 4(e), an $SiO_2$ layer 14 is deposited to a thickness of 1200 nm by a CVD process and polished to a thickness of 800 nm by a CMP process to flatten the surface (step 8). Then, a pattern of Al wiring 15 is provided for connecting between the upper electrodes 2 and the silicon semiconductor substrate 4, as shown in FIG. 4(f).

While the first embodiment causes the Pt layer 8 incorporating the lower electrodes 1 to generate a crystalline strain at the surface during the removal of the nitride layer of surface protective layer with the use of heated phosphor, this embodiment is capable of attenuating the crystalline strain at the surface of the Pt layer 8.

The method of the second embodiment carries out the photolithography process two times for forming the cross points: the step of patterning the lower electrodes 1 (step 2) and the step of patterning the upper electrodes 2 (step 7). Also, the lower electrodes 1 and the upper electrodes 2 are patterned at equal intervals of the unit pitch F as shown in FIG. 1. The area of a unit memory or cell at the cross point between the upper electrode 2 and the lower electrode 1 (which cross each other at a right angle) is expressed by 2F by 2F along both the directions of the lower electrode 1 and the upper electrode 2 respectively. More particularly, the cell area in the semiconductor memory device is sized by $2F \times 2F = 4F^2$ as denoted by the real line in FIG. 1.

Third Embodiment

The third embodiment will now be described in the form of a method for manufacturing a semiconductor memory device. FIGS. 5(a), 5(b), 5(c), 5(d), 5(e), 5(f), and 5(g) are cross sectional views taken along the line A-A' and the line B-B' of FIG. 1 showing a process of manufacturing the embodiment.

The process starts with depositing a BPSG layer 5 of 1500 nm thick on a silicon semiconductor substrate 4 accompanied with a memory circuit and polishing the same to a thickness of 1000 nm by a CMP process to have a planar surface. Then, a contact plug 6 is provided for connecting between the silicon semiconductor substrate 4 and the lower electrodes 1. In succession, a CVD process is conducted for depositing on the BPSG layer 5 a 200 nm thickness of an insulating SiO$_2$ layer 16 (step 1). The insulating layer is not limited to the SiO$_2$ layer but may be selected from an SiN layer, a polyimide layer, an SiOF layer, and any other applicable insulating material layer. The insulating layer is deposited by any appropriate process such as pulsed laser deposition, rf sputtering, e-beam vapor deposition, thermal evaporation, organic metal deposition, spin-on deposition, or organic metal chemical vapor phase growth. Then, using a photolithography process, a stripe, L/S (line and space) pattern of masking resist (not shown) for configuring the lower electrodes is provided and a dry etching process follows for etching the SiO$_2$ layer 16 to expose the lower electrodes 1 area of the SiO$_2$ layer 16 as shown in FIG. 5(a) (step 2).

This is followed by a sputtering process for depositing a 50 nm thickness of TiN layer 17 which is made of a lower electrode material and a 300 nm thickness of Pt layer 18 on the TiN layer 17 as shown in FIG. 5(b) (step 3). The lower electrode material may be an electrically conductive oxide or any applicable conductive material. Preferably, the electrically conductive lower electrode material contains YBCO for encouraging the epitaxial growth of perovskite. The electrically conductive lower electrode material may be platinum or iridium.

Next, as shown in FIG. 5(c), the TiN layer 17 and the Pt layer 18 are flattened by a CMP process to have the SiO$_2$ layer 16 exposed at the top thus patterning the lower electrodes 1 (step 4). The flattening action is not limited to the CMP process but may be selected from spin-on, a combination of spin-on and etching back, other applicable processes, and their combination. The Pt layer 18 turning to the lower electrodes 1 after the CMP process is deposited to a thickness ranging substantially from 5 nm to 500 nm.

A sputtering process follows for depositing a PCMO layer 11 to a thickness of 100 nm which will turn to the perovskite memory materials (step 5). The perovskite material has a variable of resistivity which varies depending on the electric signal. The perovskite material is preferably selected from colossal magneto-resistant (CMR) materials and high-temperature super-conductive (HTSC) materials. For example, when the perovskite material is PCMO, its thickness ranges preferably from 10 nm to 500 nm. The perovskite material may be deposited by any appropriate process selected from pulsed laser deposition, rf sputtering, e-beam vapor deposition, thermal evaporation, organic metal deposition, sol-gel deposition, and organic metal chemical vapor phase growth. Then, a Pt layer 12 is deposited by a sputtering process on the PCMO layer 11, which will turn to the upper electrodes 2 (step 6). Pt is a preferable conductive material on the perovskite material. In this embodiment, the Pt layer 12 is deposited to a thickness of 100 nm. The thickness of the upper electrode material is substantially 5 nm to 500 nm.

This is followed by a photolithography process for providing a corresponding pattern of resist 13 to the upper electrodes 2 on the Pt layer 12, as shown in FIG. 5(d). With the resist 13 used as a mask, both the Pt layer 12 and the PCMO layer 11 are etched by a dry etching process. As the resist 13 has been removed, the upper electrodes 2 (from the Pt layer 12) and the memory materials (from the PCMO layer 11) are formed as shown in FIG. 5(e) (step 7).

Further, as shown in FIG. 5(f), an SiO$_2$ layer 14 is deposited to a thickness of 1200 nm by a CVD process and polished to a thickness of 800 nm by a CMP process to flatten the surface (step 8). Then, a pattern of Al wiring 15 is provided for connecting between the upper electrodes 2 and the silicon semiconductor substrate 4, as shown in FIG. 5(g).

The method of the third embodiment carries out the photolithography process two times for forming the cross points: the step of patterning the lower electrodes 1 (step 2) and the step of patterning the upper electrodes 2 (step 7). Since the lower electrodes 1 and the upper electrodes 2 are patterned at equal intervals of the unit pitch F as shown in FIG. 1. The area of a unit memory or cell at the cross point between the upper electrode 2 and the lower electrode 1 (which cross each other at a right angle) is expressed by 2F by 2F along both the directions of the lower electrode 1 and the upper electrode 2 respectively. More particularly, the cell area in the semiconductor memory device is sized by 2F×2F=4F$^2$ as denoted by the real line in FIG. 1.

The third embodiment employs a dry etching process for removing the oxide layer to pattern the lower electrodes 1 and will thus be more favorable in the miniaturization of arrangement than the first and second embodiments where the patterning of the lower electrodes 1 is conducted through dry etching the Pt layer.

As apparent from the first to third embodiments described above, the described methods allow the active layer (of memory cells) to be deposited through self-aligning with the upper electrodes 2, whereby the number of steps for the photolithography process can be reduced from three, which is essential for the prior art, to two. Also, while the cell area in the prior art is as large as 9 F$^2$, the described methods decrease the cell area to 4F$^2$.

Although the electrically conductive material used for developing the lower electrodes 1 includes, but is not limited to, either YBCO, platinum, or iridium in the first to third embodiments, it may also include at least one selected from a group of platinum based alloys, a electrically conductive oxide group of Ru, Re, and Os, and another electrically conductive oxide group of SRO(SrRuO$_3$) and LSCO((LaSr)CoO$_3$).

Although the perovskite material is PCMO in the first to third embodiments, it may be either an oxide composed of at least one element selected from a group of Pr, Ca, La, Sr, Gd, Nd, Bi, Ba, Y, Ce, Pb, Sm, and Dy and at least one element selected from a group of Ta, Ti, Cu, Mn, Cr, Co, Fe, Ni, and Ga or another oxide expressed by at least one formula (where $0 \leq X \leq 1$ and $0 \leq Z \leq 1$) selected from $Pr_{1-X}Ca_X[Mn_{1-Z}M_Z]O_3$ (where M is an element selected from a group of Cr, Co, Fe, Ni, and Ga), $La_{1-X}AE_XMnO_3$ (where AE is a bivalent alkali earth metal selected from a group of Ca, Sr, Pb, and Ba), $RE_{1-X}Sr_XMnO_3$ (where RE is a trivalent rare earth element selected from a group of Sm, La, Pr, Nd, Gd, and Dy), $La_{1-X}Co_X[Mn_{1-Z}Co_Z]O_3$, $Gd_{1-X}Ca_XMnO_3$, and $Nd_{1-X}Gd_XMnO_3$.

While the upper electrode material is formed of, but not limited to, a Pt material in the first to third embodiments, it may include, with equal success, at least one selected from a platinum group of rare metals, a group of metals Ag, Al, Cu, Ni, Ti, Ta, and their alloys, an electrically conductive oxide group of Ir, Ru, Re, and Os, and another electrically conductive oxide group of SRO(SrRuO$_3$), LSCO((LaSr)CoO$_3$), and YBCO(YbBa$_2$Cu$_3$O$_7$).

Furthermore, as for another embodiment, a step of patterning a memory circuit prior to the step of depositing the perovskite material may be provided.

Although the present invention has been described in terms of a preferred embodiment, it will be appreciated that various modifications and alterations might be made by those skilled in the art without departing from the spirit and scope of the invention. The invention should therefore be measured in terms of the claims which follow.

The invention claimed is:

1. A semiconductor memory device having a cross point structure comprising:
    a plurality of upper electrodes arranged to extend in a direction;
    a plurality of lower electrodes on a substrate and arranged to extend in a direction substantially at a right angle to the direction of the upper electrodes;
    a first insulating material on the substrate and in between the plurality of lower electrodes such that surfaces of the lower electrodes and the first insulating material are substantially coplanar; and
    a group of memory materials arranged between the upper electrodes and the surfaces of the lower electrodes and the first insulating material for storage of data,
    wherein the memory materials comprise a perovskite material, and
    wherein each of the memory materials is disposed at the lower electrodes side of the corresponding upper electrode and extends along the corresponding upper electrode,
    wherein each lower electrode spans multiple upper electrodes such that each lower electrode extends beyond a cell region of a memory cell, which is an area defined by a cross-section between the lower electrode and any upper electrode spanned by the lower electrode, and
    wherein the memory material does not extend along the lower electrodes.

2. The semiconductor memory device according to claim 1, wherein a material of the lower electrodes includes a substance for encouraging an epitaxial growth of the perovskite material.

3. The semiconductor memory device according to claim 1, wherein a material of the lower electrodes includes at least one of a platinum group of rare metals, a group of their alloys, an electrically conductive oxide group of Ir, Ru, Re, and Os, and another electrically conductive oxide group of SRO($SrRuO_3$), LSCO(($LaSr$)$CoO_3$), and YBCO($YbBa_2Cu_3O_7$).

4. The semiconductor memory device according to claim 1, wherein a material of the upper electrodes includes at least one of a platinum group of rare metals, a group of metals Ag, Al, Cu, Ni, Ti, Ta, and their alloys, an electrically conductive oxide group of Ir, Ru, Re, and Os, and another electrically conductive oxide group of SRO($SrRuO_3$), LSCO(($LaSr$)$CoO_3$), and YBCO($YbBa_2Cu_3O_7$).

5. The semiconductor memory device according to claim 1, wherein the perovskite material comprises an oxide composed of at least one of Pr, Ca, La, Sr, Gd, Nd, Bi, Ba, Y, Ce, Pb, Sm, and Dy and at least one of Ta, Ti, Cu, Mn, Cr, Co, Fe, Ni, and Ga.

6. The semiconductor memory device according to claim 5, wherein
    the perovskite material is an oxide expressed by at least one formula (where $0 \leq X \leq 1$ and $0 \leq Z < 1$) selected from
    $Pr_{1-X}Ca_X[Mn_{1-Z}M_Z]O_3$ (where M is an element selected from a group of Cr, Co, Fe, Ni, and Ga),
    $La_{1-X}AE_XMnO_3$ (where AE is a bivalent alkali earth metal selected from a group of Ca, Sr, Pb, and Ba),
    $RE_{1-X}Sr_XMnO_3$ (where RE is a trivalent rare earth element selected from a group of Sm, La, Pr, Nd, Gd, and Dy),
    $La_{1-X}Co_X[Mn_{1-Z}Co_Z]O_3$,
    $Gd_{1-X}Ca_XMnO_3$, and
    $Nd_{1-X}Gd_XMnO_3$.

7. The semiconductor memory device according to claim 1, wherein a memory cell of the memory device occupies an area substantially equal to $4F^2$, where F is a minimum width of the patterning process.

* * * * *